(12) United States Patent
Eichelberger et al.

(10) Patent No.: US 11,150,304 B2
(45) Date of Patent: Oct. 19, 2021

(54) BATTERY PERFORMANCE PREDICTION

(71) Applicant: HEWLETT-PACKARD DEVELOPMENT COMPANY, L.P., Houston, TX (US)

(72) Inventors: Matheus Eichelberger, Porto Alegre (BR); John Landry, Houston, TX (US); Marcio Maraschin, Porto Alegre (BR); Roberto Argenta Coutinho, Porto Alegre (BR)

(73) Assignee: Hewlett-Packard Development Company, L.P., Spring, TX (US)

( * ) Notice: Subject to any disclaimer, the term of this patent is extended or adjusted under 35 U.S.C. 154(b) by 443 days.

(21) Appl. No.: 15/748,617

(22) PCT Filed: Nov. 25, 2015

(86) PCT No.: PCT/US2015/062733
§ 371 (c)(1),
(2) Date: Jan. 29, 2018

(87) PCT Pub. No.: WO2017/091231
PCT Pub. Date: Jun. 1, 2017

(65) Prior Publication Data
US 2019/0004118 A1 Jan. 3, 2019

(51) Int. Cl.
*G01R 31/382* (2019.01)
*G01R 31/392* (2019.01)
(Continued)

(52) U.S. Cl.
CPC ......... *G01R 31/382* (2019.01); *G01R 31/367* (2019.01); *G01R 31/392* (2019.01);
(Continued)

(58) Field of Classification Search
CPC .. G01R 31/367; G01R 31/382; G01R 31/392; G06Q 10/04; H01M 10/425; H01M 10/44
(Continued)

(56) References Cited

U.S. PATENT DOCUMENTS 9,058,038 B2 6/2015 Zhang et al.
2002/0120906 A1* 8/2002 Xia ...................... G01R 31/367
716/111
(Continued)

FOREIGN PATENT DOCUMENTS

| CN | 204177943 U | 2/2015 |
|---|---|---|
| CN | 104767001 A | 7/2015 |
| JP | 2015059924 A | 3/2015 |

OTHER PUBLICATIONS

Kumar (Calibration and validation of regression model for non-destructive leaf area estimation of saffron, (4 pages)). (Year: 2009).*
Xing, Y et al, "Prognostics and Health Monitoring for Lithium-ion Battery", Aug. 6, 2011.

*Primary Examiner* — Andre Pierre Louis
(74) *Attorney, Agent, or Firm* — HP Inc. Patent Department

(57) ABSTRACT

Examples described herein include examples of method for predicting battery performance of a battery comprising collecting battery data corresponding to a plurality of batteries with characteristics similar to the battery during a first time period, storing the collected battery data in a staging memory, generating a logarithmic regression based on the collected battery data, and predicting battery performance for the battery based on the logarithmic regression.

18 Claims, 6 Drawing Sheets

(51) Int. Cl.
*G01R 31/367* (2019.01)
*G06Q 10/04* (2012.01)
*H01M 10/42* (2006.01)
*H01M 10/44* (2006.01)
*G01R 31/36* (2020.01)

(52) U.S. Cl.
CPC .......... *G06Q 10/04* (2013.01); *H01M 10/425* (2013.01); *H01M 10/44* (2013.01); *G01R 31/3647* (2019.01); *H01M 2010/4278* (2013.01)

(58) Field of Classification Search
USPC .......................................................... 703/18
See application file for complete search history.

(56) References Cited

U.S. PATENT DOCUMENTS

| | | | |
|---|---|---|---|
| 2002/0193953 A1* | 12/2002 | Hoenig | G01R 31/374 702/63 |
| 2005/0038614 A1 | 2/2005 | Botts | |
| 2011/0054815 A1 | 3/2011 | Xu et al. | |
| 2011/0301890 A1* | 12/2011 | Shirriff | G01R 31/371 702/63 |
| 2013/0106427 A1* | 5/2013 | Miller | H01M 10/42 324/430 |
| 2014/0019001 A1 | 1/2014 | Nishizawa | |
| 2014/0129163 A1* | 5/2014 | Betzner | H01M 10/486 702/63 |
| 2016/0209472 A1* | 7/2016 | Chow | B60L 58/12 |

\* cited by examiner

BATTERY PERFORMANCE PREDICTION

BACKGROUND

Many types of devices use batteries to provide mobile power and backup power capabilities. The specifications and capabilities of the batteries implemented in such devices can vary based on the requirements of the device and its intended use. For example, a power system in a mobile phone can dictate that the battery be light weight and capable of providing power for a full day of mobile use even after many charge-discharge cycles. In contrast, a battery used in a uninterruptable power supply (UPS) deployed in an office computing environment can have more relaxed weight restrictions but specify a battery chemistry formulation that allows for constant trickle charging with an energy capacity sufficient to run a connected device for a particular period of time.

Various batteries include associated monitoring capabilities. In some implementations, batteries are associated with cycle counters to track the number of charge-discharge cycles. Similarly, batteries can also be associated with or coupled to monitoring devices or circuits that can measure, track, record, and/or report other battery characteristics and states. For example, some batteries can include or be coupled to electronic circuits or devices that store identification information, battery specifications (e.g., energy capacity specifications), manufacturing information (e.g., manufacturer, build dates, lot numbers, etc.), and the like. Such circuits and devices can also include testing capabilities to measure the current maximum charge capacity, resting discharge rate, operating temperature, location, etc.

DETAILED DESCRIPTION

Figure 1:
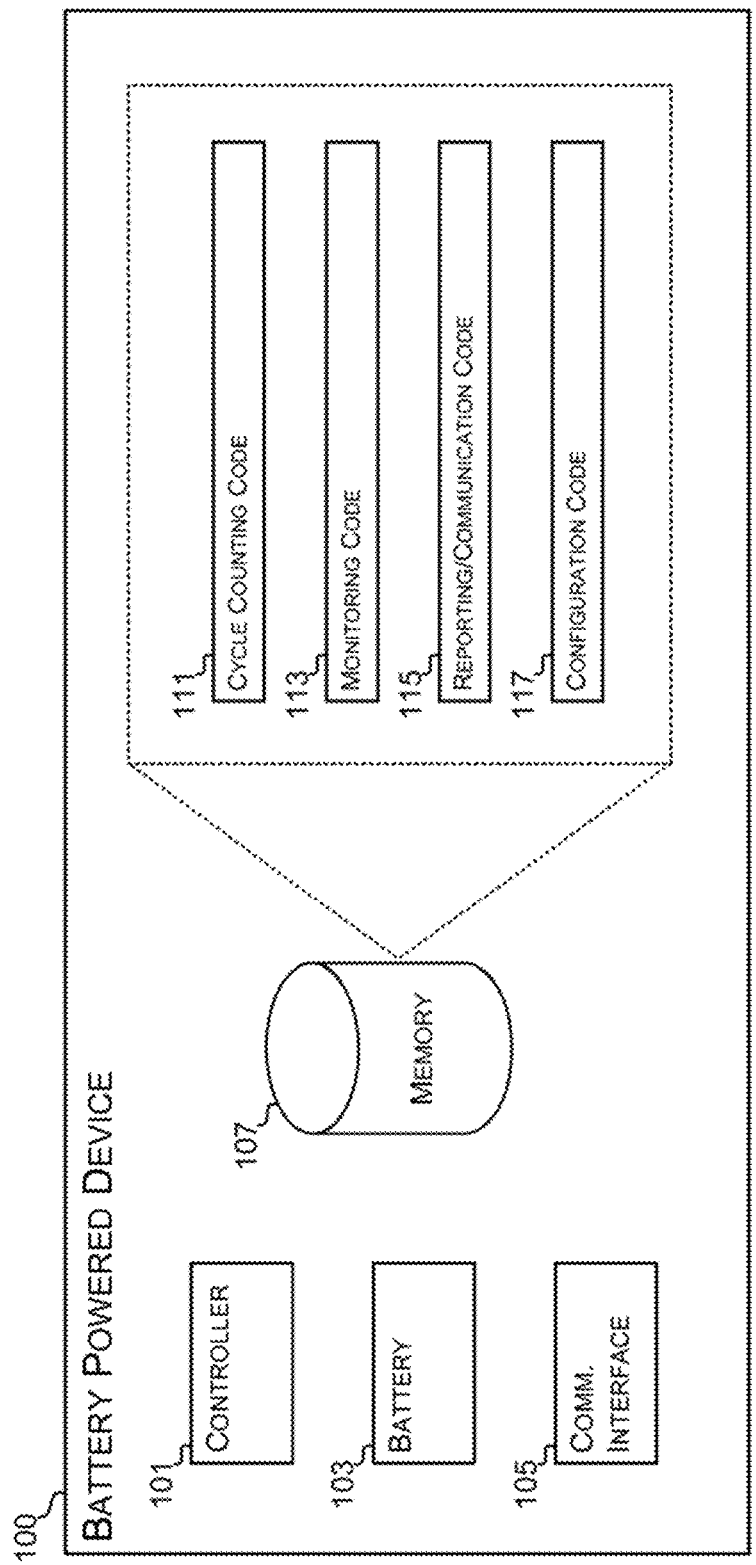
FIG. 1 illustrates a schematic view of an example battery powered device.

Example implementations of the present disclosure include systems and methods for predicting the performance of a particular battery or battery pack at any time during its lifecycle. Such implementations take advantage of the collection of large amounts of data regarding the performance of previously or concurrently deployed batteries or battery powered devices with reporting capabilities. The battery performance of any particular battery can be individually tracked and associated with its particular characteristics, operating conditions, and/or usage patterns. As such, the performance of deployed batteries can be grouped and examined based on particular battery characteristics, operating conditions, and/or usage patterns. The performance of the batteries can then be analyzed using a logarithmic regression model. The regression model can then be used to predict the battery performance of similar batteries in similar deployments. Using the predicted performance of a particular battery and/or the logarithmic regression model, feedback messages can be sent to an associated user or manufacturer. Some example feedback messages can include tips for battery usage for the end user and charging settings that the battery or associated battery powered device can use to improve performance.

Various implementations of the present disclosure can be used to address battery performance concerns of users, original equipment manufacturers, and battery makers alike. For example, many users look for devices with battery performance sufficient enough to provide a positive user experience. In various scenarios, a positive user experience can include the ability to use a mobile device without worrying about running about of power during a period of normal usage. For example, most users of smartphones expect a battery that consistently provides for smartphone usage for a full day before being recharged.

Accordingly, the importance placed on battery performance by users makes battery performance a concern for battery powered device and battery manufacturers who wish to be successful in the market. As such, that ability to predict battery performance for a particular battery is valuable capability that can lead to several technical and commercial advantages. However, predicting battery performance is complex.

Due to the variations in chemistry, battery pack design, usage, and manufacturing conditions, the prediction of battery performance quickly becomes a multivariable problem that can often defy meaningful analysis. Any one of the many interdependent variables can strongly influence the performance of a particular battery. To address the analytical complexity of battery performance prediction, methods and systems described herein use large scale, or "big data," analytical approaches to monitor battery performance of large sets or populations of batteries. In some implementations, the size of the set of batteries on the order of millions to hundreds of millions of batteries. Combining the large set of battery data over various time periods can be used to generate a predictive score for a particular battery at any point in the life cycle of the battery.

Use of big data analytical approaches in various implementations of the present disclosure can include comparing the performance of a single battery or a small group of batteries against a larger population of similar or similarly situated batteries. Various example implementations can group batteries from a particular battery model based on a particular characteristic (e.g., manufacturing date, manufacturer, deployment regions, etc.) and then compare the group to a larger population of all the batteries of that particular model. For example, batteries of a particular design or model can be grouped by their region of deployments (e.g., country of sale) and then compared to the whole population of batteries for the model. Such comparisons can provide for analysis of the effect of climate on the performance of a particular model of battery. For example, batteries deployed in tropical regions with high heat and humidity may perform better or worse than batteries deployed in regions with cold and/or dry climates.

Some implementations of the present disclosure can compare the performance of a single battery against the norm of a population of batteries. The comparison can be updated and used to continuously update the prediction of end of life of a battery based on the performance of the population of similar batteries and other variables, such as temperature, humidity, usage patterns, charging profiles, charging cycle rates, and the like, that may impact the performance of an individual battery. For instance, it is possible to isolate batteries used in a particular make/model of tablets sold in India to compare the performance of a battery in the Indian climate to the performance of similar batteries sold in other markets. Such comparisons include the use of big data approaches that include regression models.

Some example implementations of the present disclosure can also include a learning component to improve the predictive analytics described herein. For example, battery data detected outside the norm or expected performance specification can be flagged as an anomaly and trigger an alert for investigation. The anomalous data may indicate noise or can include an indication of a failure pattern not yet contemplated in the analytical models. As time passes, the analytical methods described herein can learn from the anomalies and improve the corresponding model. In addition, recognized failure patterns that can degrade battery performance can be stored in a database. The database can include links to additional information about the pattern and/or automated actions that the various entities (e.g., battery cell manufacturer, battery reseller, device maker, etc.) can take to remedy the failure. In some implementations, the predictive analysis can include a score card that includes descriptions that can be referenced for improving the quality and performance of the batteries.

FIG. 1 depicts an example battery powered device 100 that can be used to implement various aspects of the present disclosure. The battery powered device 100 can include any type of device. For example, the battery powered device 100 can be implemented as a mobile computer device, such as a laptop computer, a tablet computer, a smartphone, and the like. In other implementations, the battery powered device 100 can be a battery powered toy, tool, appliance, sensor, or any device that uses a battery 103 for standalone or backup power. In some implementations, the battery powered device 100 can be implemented as a high-capacity battery backup or storage device for powering a computing device, an appliance, a home, or building. In such implementations, the battery 103 can include multiple battery cells to hold sufficient power to power the associated device or location anticipated periods of time (e.g., on the scale of hours to days).

As shown the battery powered device 100 can include controller 101, a battery 103, a communication interface 105, and the memory 107. In various implementations, the controller 101 may be a microprocessor, a micro-controller, an application specific integrated circuit (ASIC), or the like.

According to various example implementations, the controller 101 is a hardware components, such as a circuit. In other example implementations, the controller 101 can be instantiated as an instance of a controller module executed on the battery powered device 100. The controller 101 can be coupled to, communicate with, and/or control the battery 103, the communication interface 105, and/or the memory 107. Any of the components of the battery powered device 100 can be implemented as individual devices or as composite devices that include the functionality or capabilities of one or more the components. For example, the battery 103 can include the memory 107 that can store executable code for implementing the functionality of the battery powered device 100 described herein. Similarly, the battery 103 can be implemented as a battery pack that includes battery cells, memory 107, controller 101, and/or other logic for implementing functionality described herein.

The memory 107 can include any type of transitory or non-transitory computer readable medium. For example the memory can include volatile or non-volatile memory, such as dynamic random access memory (DRAM), electrically erasable programmable read-only memory (EEPROM), magneto-resistive random access memory (MRAM), memristor, flash memory, floppy disk, a compact disc read only memory (CD-ROM), a digital video disc read only memory (DVD-ROM), or other optical or magnetic media, and the like, on which executable code may be stored.

In some example implementations, the controller 101 can access the memory 107 to access executable code stored thereon to implement various functionality. The memory 107 can include individual executable code or code segments, that when executed, cause the controller 101 or other logic device to be configured to perform various operations to implement specific functionality of the battery 103 or the battery powered device 100. For example, memory 107 can include code specific to battery state and battery performance determination functionality. In some implementations, such code can include battery cycle counting code 111, battery monitoring code 113, battery reporting/communication code 115, and battery configuration code 117.

The battery cycle counting code 111 can include instructions for performing operations to implement functionality for counting and tracking the number of times the battery 103, or components battery cells included therein, are charged and discharged. In some implementations, the battery cycle counting code 111 can be implemented as logic included in the battery 103. The battery cycle counts can be stored in the memory 107 and/or sent to functionality represented by the battery monitoring code 113 and/or the reporting/communication code 115.

In various implementations of the present disclosure use the battery cycle counts determined by the functionality provided by battery cycle counting code 111 as battery data in predicting the battery performance of the corresponding battery. In some implementations, the battery cycle count can correspond to the total lifetime battery cycle counts of the battery 103 and/or the battery powered device 100. In other implementations, the battery cycle count can correspond to a time period that begins at an arbitrary point in time (e.g., when the battery cycle count is reset to zero).

The battery monitoring code 113 can include instructions for performing operations to implement functionality for monitoring the state or performance of the battery 103. For example, the battery monitoring code 113 can perform operations to measure the current charge state, the current charge capacity, temperature, drain rate, charge rate, and other battery specific characteristics or measurements. The state or performance data can also be included in the battery data used by various implementations of the present disclosure.

In some implementations, the frequency with which the battery 103 is monitored by the functionality of the battery monitoring code 113 can be preset to a predetermined time period. In other implementations, the frequency with which the battery 103 is monitored can be determined dynamically based on information received from a remote computing system and/or the battery powered device 100. For example, during periods of frequent usage of the battery powered device 100, the battery monitoring code 113 may take measurements to determine the battery state or performance of the battery 103 more frequently than when the battery powered device 100 is unused or in a standby state.

In some implementations, the battery 103 and/or the memory 107 can also include battery usage or identification information associated with the battery powered device and/or the battery 103. For example, the battery 103 can include a memory for storing a battery identifier or serial number, a manufacturer identifier, a model number, a battery type identifier, and manufacturing date, and the like. Similarly, the memory 107, or other components of the battery powered device 100, can include information about the usage scenario or deployments of the battery powered device 100 and/or the battery 103. For example, such battery powered device specific data can include the battery charging cycle counts, location of sale and/or usage, temperature, charging patterns, energy usage settings, charging rates, discharging rates, humidity levels, and the like.

Any data associated with the identification, state, performance, or usage of a particular battery 103 in a particular battery powered device 100 is referred to herein generically as battery data. The battery data collected from a particular battery powered device 100 and/or battery 103, may include a standardized set of battery data uniform across all batteries 103 used in implementations of the present disclosure. Alternatively, the battery data collected from different batteries 103 and/or battery powered devices 100 may include disparate sets of battery data. For example, some battery data may include manufacturer and model identifiers and battery data, while other battery data may include manufacturer and model identifiers, battery performance data, as well as usage location, temperature, cycle count, and charging settings. As such, the battery data received from many battery powered devices 100 and/or batteries 103 can be grouped according to any and all information included in the battery data. Various implementations of the present disclosure make use of the ability to group the battery data based on particular characteristics of the batteries 103 reported to a battery performance prediction system described herein.

Any battery data, such as information or data determined by the battery monitoring code 113, can then be stored in the memory 107 or reported by the controller 101 or the battery powered device 100 to a remote computing system for analysis. In some implementations, the battery monitoring code 113 can temporarily store battery data in the memory 107 until a communication link between the battery powered device 100 and remote computing system can be established. The functionality for reporting of the battery data determined by the battery monitoring code 113 can be provided by functionality defined in the reporting/communication code 115.

The reporting/communication code 115 can include functionality for retrieving and/or parsing battery data from the memory 107 or directly from the monitoring code 113 in preparation for transmission of the battery data to remote computing system. As such, the reporting/communication code 115 can also include instructions for performing operations to format, compress, and/or transmit the battery data in the particular form over an associated communication protocol and/or medium to a remote computing device. In such implementations, the reporting/communication code 115 can cause the controller 101 and/or the communication interface 105 to send the battery data to the remote computer system for analysis in a specific format and/or specific frequencies.

In various examples, the memory 107 can also include battery configuration code 117. In some implementations, the battery configuration code 117 can include functionality for receiving signals or messages from a remote computing device. Such signals or messages can include instructions or settings for instructing users or the controller 101 for increasing or prolonging the battery performance of the battery 103. Signals or messages received from a remote computing system can include feedback messages that instructions or settings that the controller 101 can use to optimize the charge capacity or duty cycle of the associated battery 103 for use in a particular environments or usage scenario. For example, the controller 101 can execute the configuration code 117 to use the instructions or settings to change the charging voltage profile as a function of time when the battery 103 is used in extreme high or low temperatures to increase the lifespan of the battery 103. In another example, the controller 101 can execute the configuration code 117 to generate a user interface or alert message to make suggestions to the user to change their usage or charging habits to prolong the lifespan of the battery 103 or battery performance of the battery 103.

Figure 2:
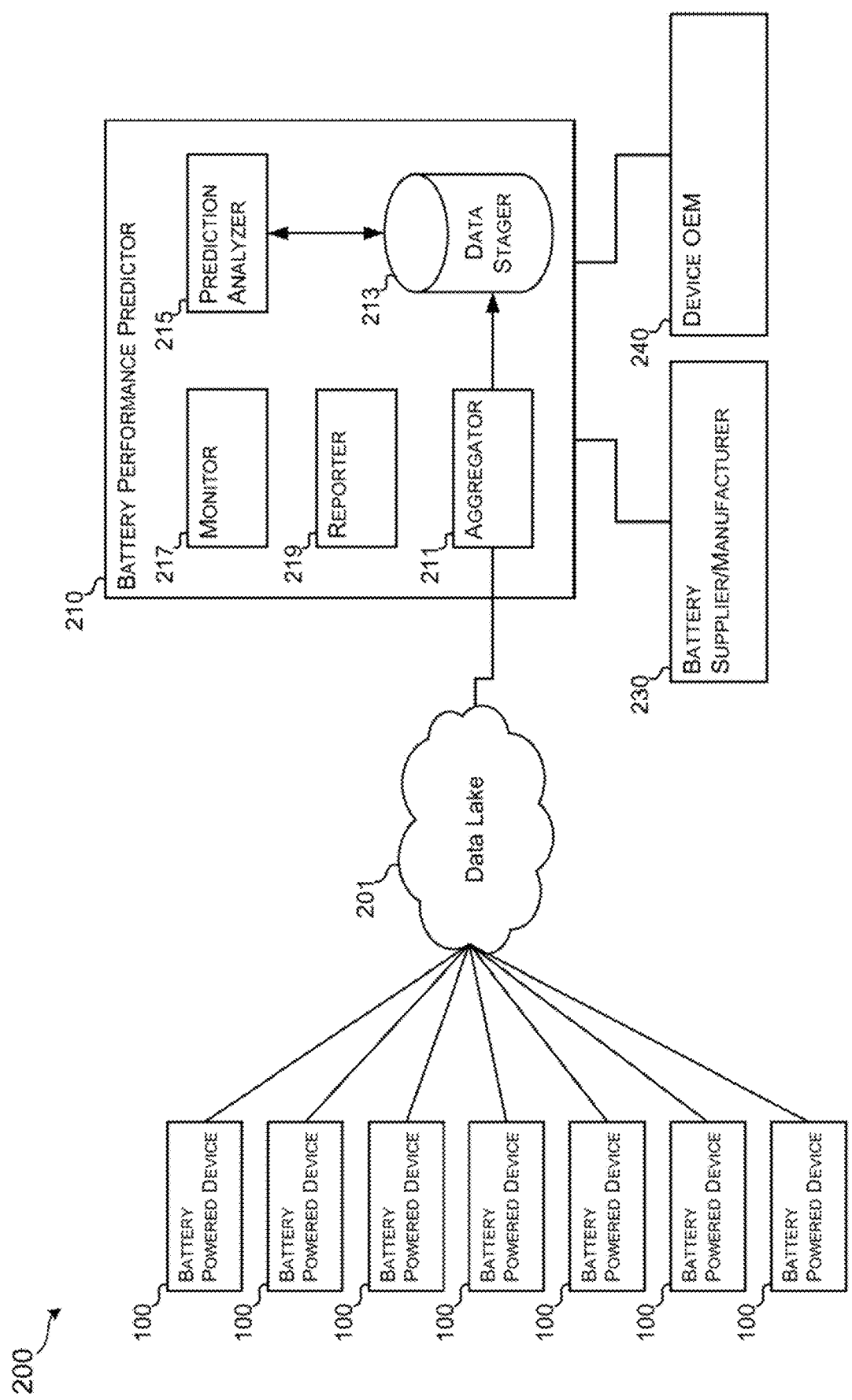
FIG. 2 depicts a schematic view of an example system for predicting battery performance.

FIG. 2 depicts a battery performance prediction system 200 for predicting future battery performance of batteries and battery types based on battery data determined from monitoring and analyzing battery data associated with batteries 103 deployed in multiple battery powered devices 100. While only a few battery powered devices 100 are depicted in FIG. 2, implementations of the present disclosure can include monitoring and analyzing battery data from large numbers of battery powered devices 100 and/or batteries 103 (e.g., on the order of millions to hundreds of millions individual units).

In various implementations, battery performance prediction system 200 can monitor and analyze the battery performance of corresponding batteries 103. In such implementations, each battery 103 can include or be connected to functionality for determining and reporting corresponding battery data directly to the data lake 201 or the battery performance predictor 210 using a corresponding communication protocol and/or medium. For example, the batteries 103 may use so-called Internet of Things (IoT) type communication hardware and/or protocols to communicate battery data to the data lake 201 and/or battery performance predictor 210. In some implementations, as described herein, a battery powered device 100 can include functionality for determining and reporting corresponding battery data directly to the data lake 201 or the battery performance predictor 210 using a corresponding communication protocol and/or medium.

In accordance with various example implementations of the present disclosure, battery data from the battery powered devices 100 can be collected in a data lake 201. In some example implementations, the data lake 201 can be a centralized data collection and storage computing system. In other example implementations, the data lake 201 can include a distributed data collection and storage system instantiated in one or more physical or virtual computing systems in a cloud computing system. The collection or reporting of battery data in the data lake 201 can occur periodically or on an ongoing basis. As such, the battery powered device 100 and/or the corresponding batteries 103 can report battery data based on input received from users and/or the battery performance predictor 210.

As shown, the battery performance predictor 210 can be coupled to the data lake 201. The battery performance predictor 210 can include functionality depicted in FIG. 2. For example, the battery performance predictor can include a data aggregator 211 for retrieving and aggregating battery data from the data lake 201. The aggregation of battery data can include the search, retrieval, and grouping, of battery data according to particular characteristics of the corresponding batteries 103 and/or battery powered devices 100. For example, the aggregator can collect a set of battery data based on the model, lot, battery powered device type (e.g., brand or model of smartphone/tablet) or deployment region of the corresponding batteries 103. The aggregator 211 can then store the aggregated battery data in the data stager 213 (e.g., an aggregated battery data database).

In some implementations, aggregating the battery data can include various sub processes, calculations or analysis. In one example implementation, the aggregator 211 can aggregate the battery data corresponding to a selection of batteries by cycle count. The aggregator 211 can then calculate the current charge capacities for the corresponding batteries. The current charge capacity can be calculated by dividing the median full charge capacity for the particular cycle count by the design charge capacity. The aggregator 211 can store the results in the data stager 213.

As described herein, the battery data can be grouped for comparison. For example, all batteries deployed in a particular battery powered device model can be compared by cell manufacturer, by location of use (e.g., country, region, zip code, etc.), or other battery characteristic. A logarithmic regression model for each group can then generated. In one example implementation, the logarithmic regression model can be calculated based on the following equation:

$$f(x)=a+b*\ln(x) \quad [EQ1]$$

Values for a and b can be found using a least squares fitting:

$$b = \frac{n*\sum y*\ln(x) - \sum y * \sum \ln(x)}{n*\sum \ln(x)^2 - (\sum \ln(x))^2} \quad [EQ\ 2]$$

$$a = \frac{\sum y - b*\sum \ln(x)}{n} \quad [EQ\ 3]$$

Where:
  x is the cycle count
  y is the median of the charge capacity for the cycle count x
  n is number of cycles for which data is available According to various example implementations, the logarithmic regression model based on the battery data can provide a representation of the expected battery life for a particular battery or battery powered device. The end of life for a particular battery can be defined by the charge cycle count at which the charge capacity, or battery performance characteristic, of that particular battery degrades below a particular threshold (e.g., the charge capacity drops below a certain threshold capacity). As such, implementations of the present disclosure can use the logarithmic regression model to predict the charge cycle at which the end of life for a particular battery will occur based on the performance of a population of similar batteries used in similar battery powered device and/or other similar usage scenarios. An example of a comparison of the battery performance regression models for various models of batteries and a theoretical decay curve are described in more detail in reference to FIG. 5 below.

The ability to predict expected battery life can be a valuable tool, however, it can be difficult to compare two different sets of batteries using only a regression model. To increase the utility of such regression models, it is possible to create a scoring or grading system to describe battery performance. In some implementations, a score or grade for a battery can be generated by integrating the logarithmic regression function to a certain cycle interval, for example from 1 to 1000 cycles:

$$\int_1^{1000} a+b*\ln(x)dx \quad [EQ4]$$

The result of the integration of EQ1 depicted in EQ4 can provide for simple comparisons between different sets of batteries. For example, based on corresponding integrations of the associated logarithmic regression models, it is possible to compare one set of batteries to the battery specification for that set. Similarly, it is possible to compare one model of battery (model A) to another model of battery (model B). It is also possible to compare the performance of certain battery suppliers performing to the performance of other battery suppliers. It is also possible to compare the performance of batteries of similar design from a common source as used in different regions (e.g., geographic or environment conditions).

In various implementations, a grade can be generated for every battery based on the comparison of the predicted performance to the specified performance and the overall performance of the batteries used in a product. To increase the accuracy of the predicted battery performance, some example implementations can include other variables, such as temperature, charging profile, usage pattern, and the like, can be included in the logarithmic regression model to improve accuracy.

Figure 4:
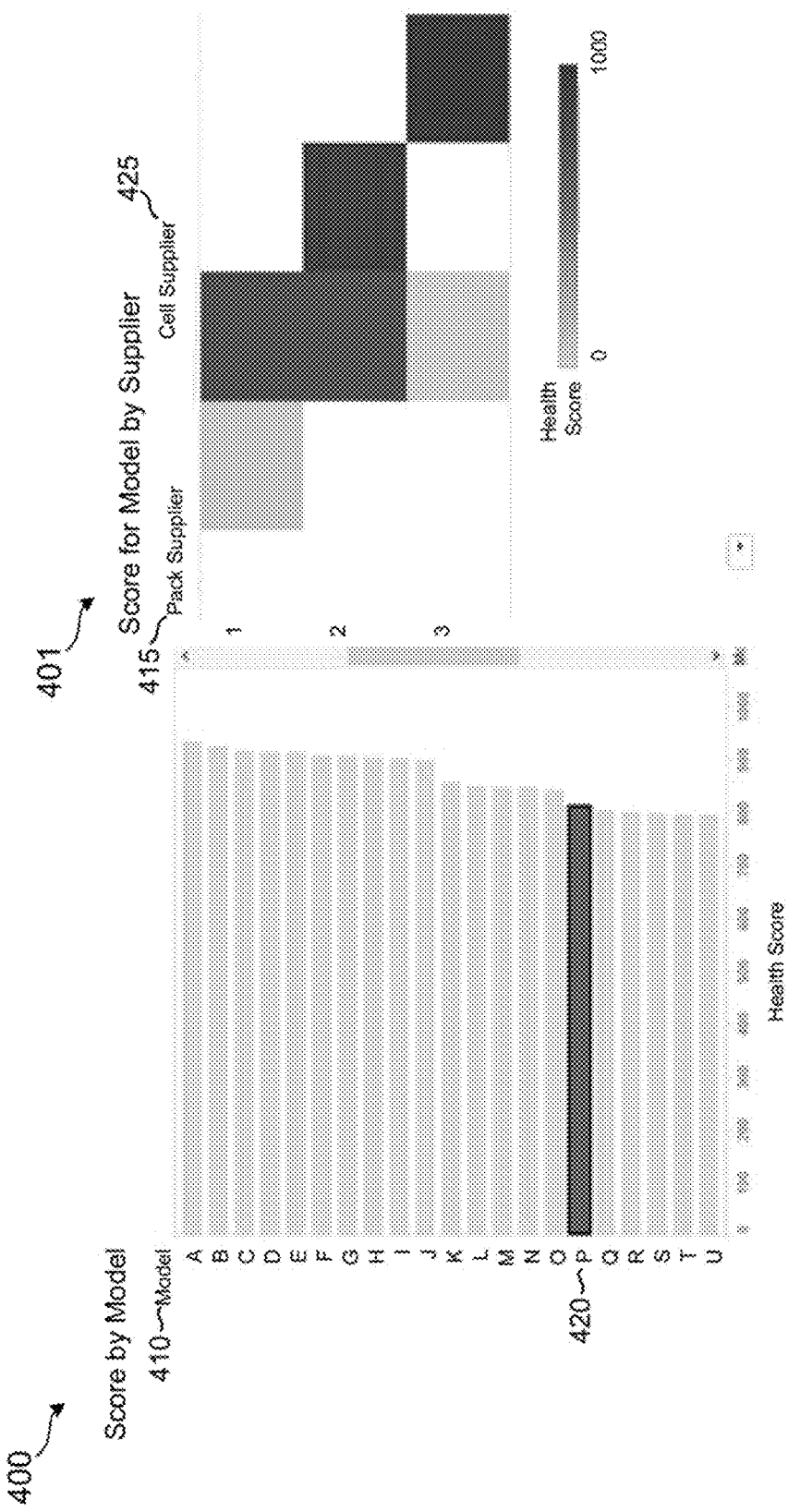
FIG. 4 illustrates an example comparison of battery performance scores.

Grading the predicted battery performance can provide product designers with simplified insight based on real data corresponding to how batteries are performing in the field. The visual analytics and graphs depicted in FIG. 4 illustrate an example of battery performance comparisons. In the diagram in view 400, shows battery models compared against one another, while the diagram in view 401 depicted an drill-down inspection of the suppliers for battery cells and battery packs used in a particular battery model. In some implementations, the comparisons can be based on an aggregated score applied to the population of batteries.

In some implementations, it is possible to compare the logarithmic regression model to the specified decay curve to determine the deviation of performance decay associated with various subsets of batteries from the expected decay curve for the corresponding types of batteries. The chart in FIG. 5 depicts the expected battery performance for two models of batteries, calculated using the formula in EQ1 and compared to a theoretical decay curve corresponding to the expected decay for the model of battery, (e.g., the decay defined in the specification supplied by the corresponding manufacturer).

Figure 5:
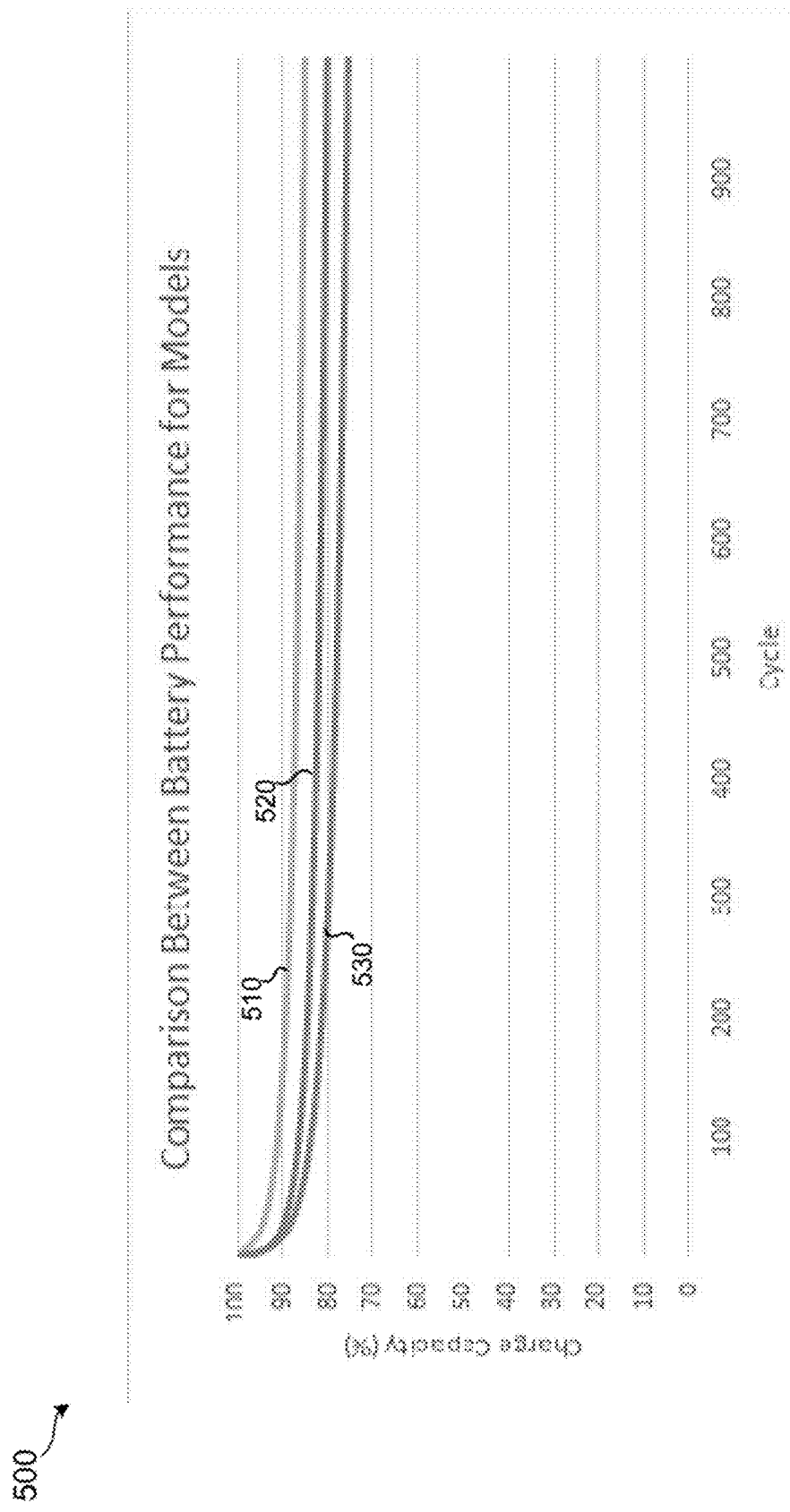
FIG. 5 illustrates a graph of example battery performance models.

Using a chart like the example depicted in FIG. 5, it is possible to compare the battery performance of a particular battery with the predicted performance for the corresponding type of battery and the theoretical performance model. In some implementations, the prediction analyzer 215 can grade a battery 103 based on such comparisons. In some example implementations, the grade assigned to a particular battery can be based the target demographic or use of the battery. If the target demographic is the end-users of a particular device, the focus can be on the current battery charge performance instead of the life-cycle performance. For example, the grading can be a numeric score on a scale that indicates a placement in a ranking of current battery charge performance relative to other batteries for which data is available. One example scale that can be used for battery unit grading and for monitoring battery quality can include rankings from "0" to "4." A score of "0" can indicate the current charge performance of the battery is at 50%, a score of "1" can indicate current charge performance of the battery is below 80%, a score of "2" can indicate the current charge performance of the battery is below the projected performance, "3" can indicate the current charge performance of the battery is above the projected performance, and a score of "4" can indicates the current charge performance of the battery is above the specification.

As depicted in FIG. 2, the battery performance predictor 210 can include various functionality in addition to the aggregator 211. Any of the functionality of the battery performance predictor 210 depicted in the FIG. 2 or described herein can be implemented as any combination of hardware (e.g., a processor) and executable code. As described in reference to FIG. 3, the executable code can be stored on a memory and executed by virtual logic or hardware that causes the virtual logic or hardware to be configured to perform operations to implement the functionality described herein. For example, in some implementations, the battery performance predictor 210 can include functionality for performing the operations described herein in reference to the aggregator 211 and the data stager 213.

In various implementations, the battery performance predictor 210 can also include functionality of monitor 217, reporter 219, and prediction analyzer 215. The prediction analyzer 215 can perform analytical operations on aggregated battery data in the data stager 213 and/or the data lake 201 to predict the battery performance of a particular battery. For example, prediction analyzer 215 can compare logarithmic regression models and/or the integrated logarithmic regression formulas based on a charging cycle count. The prediction analyzer 215 can then use the comparison to predict the lifespan of a particular battery based on its charging cycle count and/or its current charge capacity. The prediction analyzer 215 can then send the prediction to the reporter 219. The reporter 219 can then send the battery lifespan prediction to one or more of the battery powered devices 100, battery suppliers/manufacturers 230, and/or a device original equipment manufacturer (OEM) 240.

In such implementations, the associated battery powered device 100, the battery suppliers/manufacturers 230, and/or device OEM 240 can make changes to corresponding usage, manufacturing, and/or implementation of similar or corresponding batteries 103. In such implementations, the reporter 219 can include instructions for improving the battery performance of a particular battery 103 and/or a type or design of a particular battery 103. For example, reporter 219 can send instructions for changing the charging profile to an associated battery powered device 100. Such instructions can include instructions for generating a user interface prompt to educate the user and/or instructions that can cause the battery powered device 100 to automatically change the time variable current/voltage levels with which the battery 103 is charged.

The monitor 217 can monitor changes to the aggregated battery data in the data stager 213 so that deviations from expected battery data can be noted or flagged. In other implementations, the monitor 217 can monitor the battery performance of individual or sets of batteries 103 to detect changes in battery characteristics (e.g., the current charge capacity of a particular battery 103). When a change in a battery characteristic is detected, the monitor can generate a message that the battery performance predictor 210 and/or the reporter 219 can use to generate a feedback message to a corresponding battery powered device 100, battery supplier/manufacturer 230, and/or device OEM 240.

Figure 3:
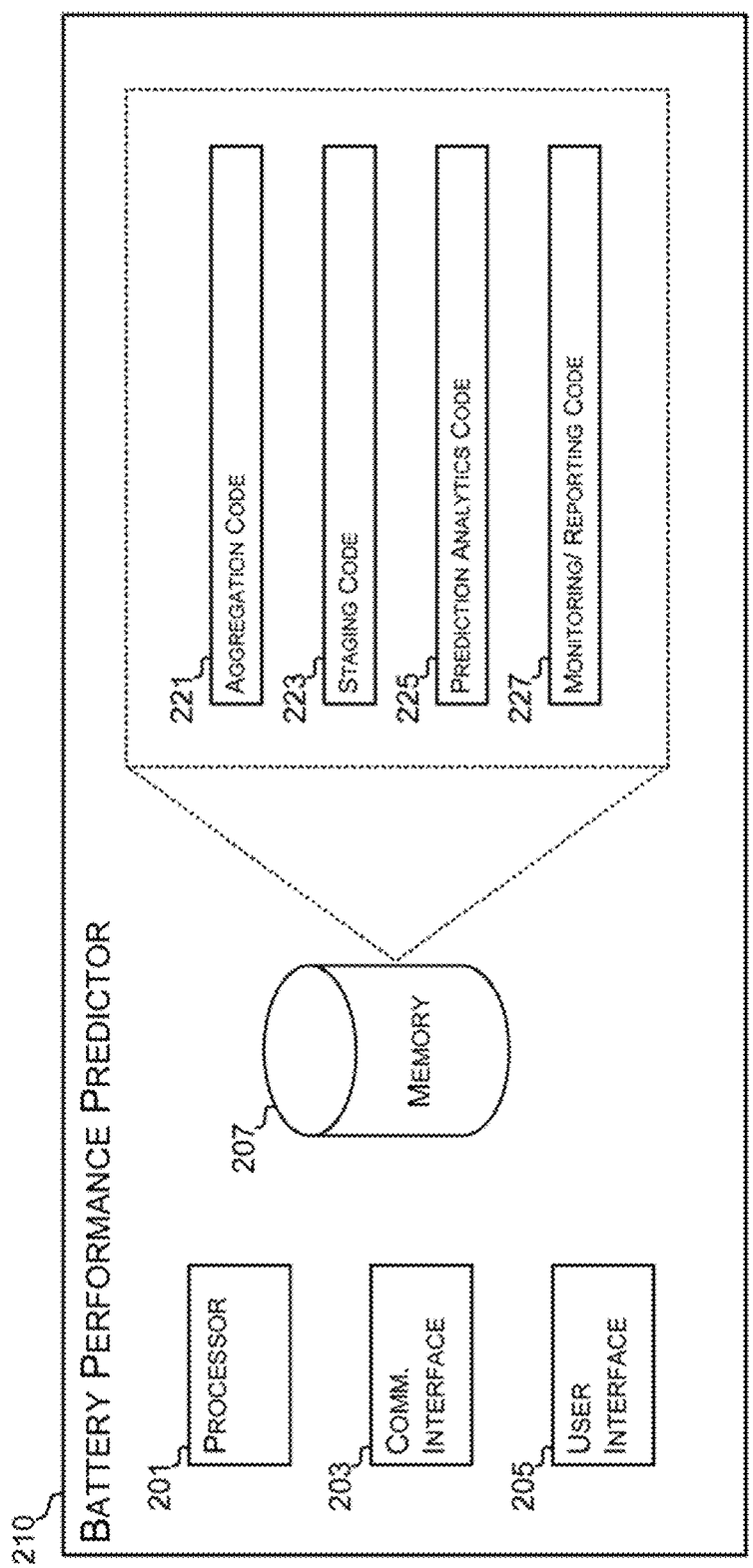
FIG. 3 depicts a schematic view of an example battery performance predictor.

FIG. 3 depicts a detailed view of the battery performance predictor 210 according to various implementations of the present disclosure. In the particular implementation depicted in FIG. 3, the battery performance predictor 210 can include a processor 201, a communication interface 203, a user interface 205, and a memory 207. As such, the battery performance predictor 210 can be implemented as a physical or virtual computer system.

According to various example implementations, the processor 201 is a hardware components, such as a circuit. In other example implementations, the processor 201 can be instantiated as an instance of a processor module executed on a computing system. The processor 201 can be coupled to, communicate with, and/or control the communication interface 203, user interface 205, and/or the memory 207. Any of the components of the battery performance predictor 210 can be implemented as individual devices or as composite devices that include the functionality or capabilities of one or more the components.

In some example implementations, the processor 201 can access the memory 207 to access executable code stored thereon to implement various functionality. The memory 207 can include individual executable code or code segments, that when executed, cause the processor 201 or other logic device to be configured to perform various operations to implement specific functionality of the battery performance predictor 210 described herein. For example, memory 207 can include code specific to battery state and battery performance determination functionality.

In some implementations, such code can include battery aggregation code 221, staging code 223, prediction analytics code 225, and monitoring/reporting code 227. The aeration code 221 can include instructions that cause the processor 201 to implement the functionality of the aggregator 211 described herein. The staging code 223 can include instructions that cause the processor 201 to implement the functionality of the data stager 213. Similarly, the prediction analytics code 225 can include instructions that cause the processor 201 to implement the functionality of the prediction analyzer 215 and other various functionality described herein. Finally, the monitoring/reporting code 227 can include instructions that cause the processor 201 to implement the functionality of the monitor 217 and/or reporter 219 described herein.

The memory 207 can include any type of transitory or non-transitory computer readable medium. For example the memory can include volatile or non-volatile memory, such as dynamic random access memory (DRAM), electrically erasable programmable read-only memory (EEPROM), magneto-resistive random access memory (MRAM), memristor, flash memory, floppy disk, a compact disc read only memory (CD-ROM), a digital video disc read only memory (DVD-ROM), or other optical or magnetic media, and the like, on which executable code may be stored.

FIG. 4 depicts two example charts that can be generated in a user interface based on the analysis data generated by various implementations described herein. For example, the user interface 205 can access battery and analytical data generated by the processor 201 executing the various executable code stored in the memory 207 to generate a graphical user interface. In the particular example user interface shown, the score by model of view 400 of the data can include a bar chart of the health score of various models 410 of batteries deployed. Each of the numeric health scores can be based on an integration of the logarithmic regression model for a particular population of a model of battery. In the example shown, the models 410 are designated by an associated letter code (e.g., A through U). Any one of the health scores can be selected to drill down further into the data to explore the distribution of health scores or other battery performance data used in the composite score. In the example shown, model P 420 is selected.

In response to the selection of the battery model P 420, implementations of the present disclosure can generate a user interface that can show additional detail regarding the battery performance broken down by other battery characteristic. For example, the user interface 205 can generate a score for a particular model of battery by supplier view 401. As shown, view 401 includes a shade density-coded battery health score graph that indicates the health by battery pack supplier 415 and battery cell supplier 425. The term "battery pack" can refer to any device that includes a battery cell and other components (e.g., a combination of battery cells, terminals, charge cycle counter, battery meter, etc.), whereas, the term "battery cell" can refer to any type combination of container and chemistry that can store, discharge, or generate electrical charge, current, or voltage. As such, the view 401 can include indications of battery health scores for the model P 420 battery that may be manufactured by multiple battery pack suppliers 415 using battery cells from multiple battery cell supplier is 425. Such information can be used by a customer of battery packs and/or battery cells to determine which combination results in the highest performing battery packs.

The chart 500 depicted in FIG. 5 illustrates the expected battery performance for two models of battery packs. In the particular example shown graphs of the percentage charge capacity as a function of cycle count for battery model 510 and battery model 520 can be calculated using the logarithmic regression model and least squares fit of EQ1, EQ2, and EQ3 described herein. The graphs calculated for battery models 510 and 520 can be compared to theoretical graph 530 that represents the expected decay for a battery specification on which the battery models 510 and 520 are based. In the example shown in chart 500, battery model 510 performance better than battery model 520, while both battery models 510 and 520 appear to perform better than the theoretical graph 530.

The graphs of the expected battery performance for battery models 510 and 520 can be used to predict the battery lifespan of a particular battery of model type 510 or 520 based on its current charge cycle count. As shown, the expected percentage charge capacity for particular battery of either model is expected to stay above 80% for both models at least until 500 charging cycles.

Figure 6:
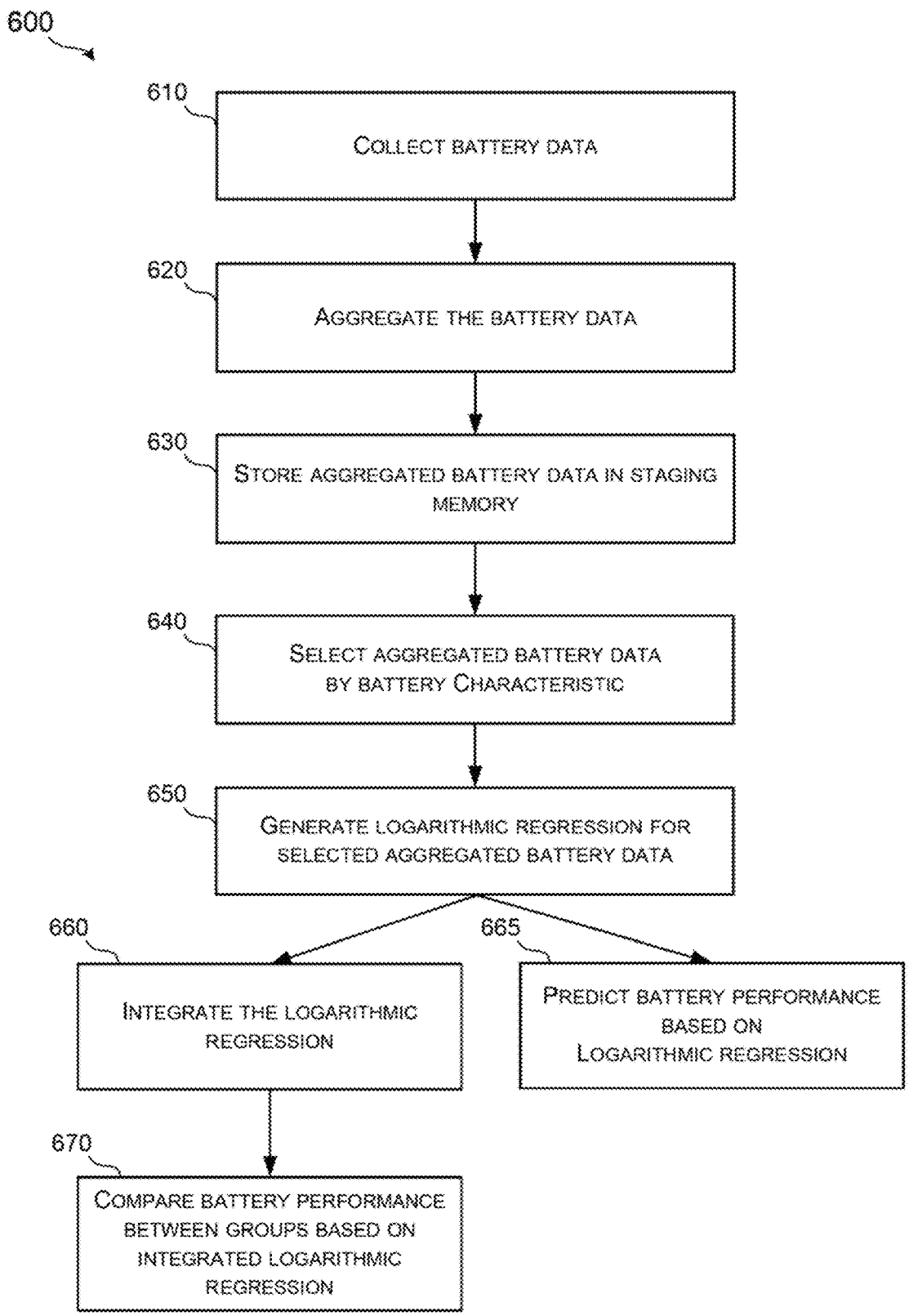
FIG. 6 is a flowchart of an example method for predicting the performance of batteries.

FIG. 6 depicts a flowchart 600 of an example method according to various implementations of the present disclosure. The method 600 can begin at box 610 in which battery data is collected from a population of batteries 103. Collection of the battery data can be facilitated by an agent module or subroutine that measures, monitors, and/or reports battery data corresponding to a particular battery 103. In some implementations, the battery 103 can be deployed in a particular battery powered device 100, while in other implementations the battery 103 can be a standalone device on its own. In other such implementation, the battery data can include a measurement or score of a current charge or charge capacity and/or charging cycle count. For example, the battery data can include account that corresponds to the number of times a particular battery 103 has been discharged and recharged.

Collection the battery data can be facilitated by an intermediate data lake 201, or other distributed or centralized data collection mechanism, that can receive and/or store battery data from many batteries 103 and/or battery powered devices 100. The battery lake 201 can temporarily store the battery data received from the many batteries 103 or battery powered devices 100 until it is needed by the battery performance predictor 210.

At box 620, the battery performance predictor 210 can aggregate the battery data by any number of battery specific characteristics. For example, the battery performance predictor 210 can aggregate the battery data based on associated battery characteristics such as, models, types, manufacturing date, manufacturer, sale region, deployment region, usage scenario, and the like. In some implementations, the aggregated battery data can be used to represent different populations or sets of batteries based on similar battery characteristics. The aggregated battery data can then be stored in a staging memory 213 at box 630.

At box 640, the battery performance predictor 210 can select various groups of aggregated battery data based on the desired battery characteristic. For example, the battery performance predictor 210 can retrieve all battery data for a particular model (e.g., model A) of battery having a particular charging cycle count range (e.g., counts between 500 and 600).

At box 650, the battery performance predictor 210 can generate a logarithmic regression model for the particular group of aggregated battery data. The logarithmic regression model can be based on all of the battery data available for the particular group of batteries.

At box 660, the battery performance predictor 210 can then integrate the logarithmic regression for some number of charge cycle counts. In one example described herein, the logarithmic regression model can be integrated for 1 to 1000 charging cycles. At box 670, the battery performance predictor 210 can then compare the battery performance between various groups of batteries based on the associated integrated logarithmic regression model. In some implementations, the comparison can include generating multiple percentage battery charge capacity graphs as a function of charging cycle count. In similar implementations, the pick comparison can include a comparison of a theoretical specification based battery charge capacity graphs as a function of charging cycle count with the integrated logarithmic regression model.

In some implementations, the prediction of a particular battery performance can be made based on the logarithmic regression model, at box 665. In such implementations, the future performance of a battery 103 having characteristics similar to a group of batteries 103 for which a logarithmic regression model has been calculated can be predicted. For example, if a particular battery 103 is known to have a particular charging cycle counts and a particular percentage battery capacity, it can be matched to a logarithmic regression model to predict the cycle count at which its percentage charge capacity will fall below a predetermined threshold marking the end of this lifespan.

These and other variations, modifications, additions, and improvements may fall within the scope of the appended claims(s). As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise. All of the features disclosed in this specification (including any accompanying claims, abstract and drawings), and/or all of the elements of any method or process so disclosed, may be combined in any combination, except combinations where at least some of such features and/or elements are mutually exclusive.

What is claimed is:

1. A battery performance prediction system comprising:
   an aggregator to aggregate battery data based on a characteristic of a plurality of battery devices;
   a data stager to store the aggregated battery data; and
   a prediction analyzer to:
   generate a logarithmic regression model based on at least some of the battery data and to generate a prediction of battery performance for a particular battery based on the logarithmic regression model; and generate respective predictive scores for the battery devices, based on the logarithmic regression model, at any point in a life cycle of the battery devices to provide a comparison between the battery devices and one or more different battery device sets, the respective predictive scores for the battery devices comprising numerical grades generated by integrating logarithmic regression of associated logarithmic regression models for different sets of the battery devices, to a give cycle interval, the numerical grades to provide for comparisons between the different sets of the battery devices or to a specified performance.

2. The system of claim 1 further comprising a reporter to provide a feedback message based on the prediction.

3. The system of claim 2 wherein the reporter sends the feedback message to a manufacturer or end user.

4. The system of claim 1 further comprising a monitor to monitor changes in the logarithmic regression model.

5. The system of claim 1 wherein to generate the prediction of the battery performance for the particular battery comprises matching a battery count corresponding to the particular battery to the logarithmic regression model.

6. The system of claim 1, wherein the logarithmic regression model comprises $f(x)=a+b*\ln(x)$, where "x" is a battery cycle count, and "a" and "b" are determined from a least squares fitting to the at least some of the battery data.

7. A method comprising:

aggregating battery data corresponding to a plurality of batteries according to a plurality of battery characteristics;

selecting aggregated battery data based on a selected battery characteristic from the plurality of battery characteristics;

generating a logarithmic regression based on the selected aggregated battery data;

predicting battery performance for a particular battery, and one or more different battery sets of the plurality of batteries, by generating respective predictive scores based on the logarithmic regression, the respective scores comprising numerical grades generated by integrating logarithmic regression functions of the logarithmic regression, to a given cycle interval, the numerical grades to provide for comparisons between the battery and the one or more different battery sets or to a specified performance; and providing, based on the respective predictive scores, a comparison between the battery and the one or more different battery device sets or the specified performance.

8. The method of claim 7, further comprising sending a predicted battery performance to a corresponding battery powered device.

9. The method of claim 8, wherein sending a predicted battery performance comprises sending battery settings.

10. The method of claim 9, wherein the battery settings comprise data that the battery powered device can use to change charging settings or initiate a user interface message.

11. The method of claim 7, wherein generating the logarithmic regression comprises:

generating multiple logarithmic regressions based on multiple corresponding selected aggregated battery data; and integrating the multiple logarithmic regressions to determine corresponding battery performances for groups of batteries in the plurality of batteries; and comparing the corresponding battery performances for the groups of batteries.

12. The method of claim 11, wherein comparing the battery performance comprises generating the numerical grades for the groups of batteries based on the comparison.

13. The method of claim 7, wherein generating the logarithmic regression comprises performing a least squares fit.

14. The method of claim 7, wherein the logarithmic regression comprises $f(x)=a+b*\ln(x)$, where "x" is a battery cycle count, and "a" and "b" are determined from a least squares fitting to the selected aggregated battery data.

15. A method for predicting battery performance of a battery comprising:

collecting battery data corresponding to a plurality of batteries with characteristics similar to the battery during a first time period;

storing the collected battery data in a staging memory;

generating respective logarithmic regressions for a plurality of batteries based on the collected battery data;

predicting battery performance for the battery by generating respective predictive scores for the battery, and the plurality of batteries, based on the respective logarithmic regressions, the respective scores comprising numerical grades generated by integrating logarithmic regression functions of the respective logarithmic regressions, to a given cycle interval, the numerical grades to provide for comparisons between the battery and one or more different battery sets of the plurality of batteries or to a specified performance; and providing, based on the respective predictive scores, a comparison between the battery and the one or more different battery sets or the specified performance.

16. The method of claim 15, further comprises:

collecting battery data corresponding to the plurality of batteries during a second time period;

updating the logarithmic regression based on the battery data collected during the second time period; and updating the predicted battery performance based on the updated logarithmic regression.

17. The method of claim 16, further comprising sending charging settings based on the updated predicted battery performance to a battery powered device associated with the battery to improve the battery performance of the battery.

18. The method of claim 15, wherein the logarithmic regression comprises $f(x)=a+b*\ln(x)$, where "x" is a battery cycle count, and "a" and "b" are determined from a least squares fitting to selected aggregated battery data.

* * * * *